United States Patent
Zhang et al.

(10) Patent No.: US 12,255,106 B2
(45) Date of Patent: Mar. 18, 2025

(54) MULTI-VT NANOSHEET DEVICES

(71) Applicant: INTERNATIONAL BUSINESS MACHINES CORPORATION, Armonk, NY (US)

(72) Inventors: Jingyun Zhang, Albany, NY (US); Takashi Ando, Eastchester, NY (US); ChoongHyun Lee, Chigasaki (JP); Alexander Reznicek, Troy, NY (US)

(73) Assignee: INTERATIONAL BUSINESS MACHINES CORPORATION, Armonk, NY (US)

( * ) Notice: Subject to any disclaimer, the term of this patent is extended or adjusted under 35 U.S.C. 154(b) by 609 days.

(21) Appl. No.: 17/527,355

(22) Filed: Nov. 16, 2021

(65) Prior Publication Data

US 2023/0154798 A1    May 18, 2023

(51) Int. Cl.
  *H01L 21/8234*   (2006.01)
  *H01L 27/088*    (2006.01)
(52) U.S. Cl.
  CPC ........... *H01L 21/823462* (2013.01); *H01L 21/823412* (2013.01); *H01L 27/088* (2013.01)
(58) Field of Classification Search
  CPC ......... H01L 21/823462; H01L 29/0673; H01L 29/088; H01L 29/0887
  See application file for complete search history.

(56) References Cited

U.S. PATENT DOCUMENTS

| | | | |
|---|---|---|---|
| 9,613,866 B2 | 4/2017 | Ando et al. | |
| 9,735,061 B1 | 8/2017 | Kim et al. | |
| 9,997,519 B1 | 6/2018 | Bao et al. | |
| 10,546,787 B2 | 1/2020 | Bao et al. | |
| 10,692,866 B2 | 6/2020 | Ando et al. | |

(Continued)

FOREIGN PATENT DOCUMENTS

EP   3836202 A1   6/2021

OTHER PUBLICATIONS

Bao et al., "Selective Enablement of Dual Dipoles for Near Bandedge Multi-Vt Solution in High Performance FinFET and Nanosheet Technologies", 2020 Symposium on VLSI Technology Digest of Technical Papers, Jun. 16, 2020 (pp. 1-2). IEEE.

(Continued)

*Primary Examiner* — John A Bodnar
(74) *Attorney, Agent, or Firm* — Tutunjian & Bitetto, P.C.; Samuel Waldbaum

(57) ABSTRACT

A method is presented for attaining different gate threshold voltages across a plurality of field effect transistor (FET) devices without patterning between nanosheet channels. The method includes forming a first set of nanosheet stacks having a first intersheet spacing, forming a second set of nanosheet stacks having a second intersheet spacing, where the first intersheet spacing is greater than the second intersheet spacing, depositing a high-k (HK) layer within the first and second nanosheet stacks, depositing a material stack that, when annealed, creates a crystallized HK layer in the first set of nanosheet stacks and an amorphous HK layer in the second nanosheet stacks, depositing a dipole material, and selectively diffusing the dipole material into the amorphous HK layer of the second set of nanosheet stacks to provide the different gate threshold voltages for the plurality of FET devices.

20 Claims, 9 Drawing Sheets

(56) References Cited

U.S. PATENT DOCUMENTS 10,825,736 B1\* 11/2020 Zhang .................. H01L 29/775
2017/0005003 A1 1/2017 Ando et al.
2020/0373300 A1\* 11/2020 Zhang ............... H01L 21/28158

OTHER PUBLICATIONS

Zhou et al., "TDDB Reliability in Gate-All-Around Nanosheet", In 2021 IEEE International Reliability Physics Symposium (IRPS) Mar. 21, 2021 (pp. 1-6). IEEE.
International Search Report from PCT/EP2022/079819 dated Feb. 9, 2023. (14 pages).

\* cited by examiner

MULTI-VT NANOSHEET DEVICES

BACKGROUND

The present invention relates generally to semiconductor devices, and more specifically, to constructing nanosheet stacks with different threshold voltages without degrading logic device performance.

In nanometer scale devices, gate structures are often disposed between fin structures or other conducting structures, such as nanosheets. In many instances, the conducting or semiconducting structures are formed closer together due to scaling to smaller node technology sizes. This can be a limiting factor in the reduction of device size scaling. While fin field effect transistors (finFETs) and/or nanosheets can benefit from tight device-device spacing, these dimensions can limit device scaling. Further, devices needing a thicker dielectric for higher voltage operation are even more limited in the allowable dimensions. Higher voltage devices for input and/or output circuits need thicker gate dielectrics as compared to standard gate devices, which have a lower voltage and can be employed, e.g., in logic devices.

SUMMARY

In accordance with an embodiment, a method is provided for attaining different gate threshold voltages across a plurality of field effect transistor (FET) devices without patterning between nanosheet channels. The method includes forming a first set of nanosheet stacks having a first intersheet spacing, forming a second set of nanosheet stacks having a second intersheet spacing, where the first intersheet spacing is greater than the second intersheet spacing, depositing a high-k (HK) layer within the first and second nanosheet stacks, depositing a material stack that, when annealed, creates a crystallized HK layer in the first set of nanosheet stacks and an amorphous HK layer in the second nanosheet stacks, depositing a dipole material, and selectively diffusing the dipole material into the amorphous HK layer of the second set of nanosheet stacks to provide the different gate threshold voltages for the plurality of FET devices.

In accordance with another embodiment, a method is provided for modulating threshold voltages for nanosheet stacks without patterning between nanosheet channels. The method includes forming first nanosheet stacks having a first intersheet spacing, forming second nanosheet stacks having a second intersheet spacing, where the first intersheet spacing is greater than the second intersheet spacing, constructing a crystallized high-k (HK) layer within the first nanosheet stacks, constructing an amorphous high-k (HK) layer within the second nanosheet stacks, depositing a dipole material, and selectively diffusing the dipole material into the amorphous HK layer of the second nanosheet stacks to modulate the threshold voltages for the nanosheet stacks.

In accordance with yet another embodiment, a semiconductor structure is provided. The semiconductor structure includes first nanosheet stacks having a first intersheet spacing, second nanosheet stacks having a second intersheet spacing, where the first intersheet spacing is greater than the second intersheet spacing, a crystallized high-k (HK) layer disposed within the first nanosheet stacks, an amorphous high-k (HK) layer disposed within the second nanosheet stacks, and a dipole material disposed within the first and second nanosheet stacks, wherein the dipole material is selectively diffused into the amorphous HK layer of the second nanosheet stacks to modulate the threshold voltages for the nanosheet stacks.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for achieving different threshold voltages for field effect transistor (FET) devices without degrading logic device performance. The methods and structures achieve multi-Vt with selective dipole diffusion on selected nanosheet regions. Nanosheets provide for viable device architectures for scaling complementary metal oxide semiconductors (CMOS) beyond the 7 nm node. Thin gate dielectric nanosheet transistors can be used, e.g., for logic and static random access memory (SRAM) applications, whereas thick gate dielectric nanosheet transistors can be used, e.g., for high voltage and analog applications.

Embodiments in accordance with the present invention provide methods and devices for achieving different threshold voltages for FET devices by introducing a dopant into the gate dielectric layer, which decreases the crystalline temperature of the gate dielectric layer. Further, by selectively crystallizing the gate dielectric in a designed device region, the dipole material can selectively diffuse through the amorphous dielectric layer, but no diffusion occurs in the crystalline dielectric layer. This enables multi-Vt without patterning between nanosheet channels. The dipole forming element is present at the interfacial layer of the high Vt nFET and the low Vt pFET. Thus, a high Vt nFET and a low Vt pFET can include a crystallized HK layer with larger intersheet spacing ($T_{sus}$), whereas a low Vt nFET and a high Vt pFET can include an amorphous HK layer, with no dopant in the HK layer, and with smaller intersheet spacing ($T_{sus}$). The crystallized HK layer has a dopant, such as ZrO, due to its lower crystallization temperature than a pure HK material.

Examples of semiconductor materials that can be used in forming such nanosheet structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
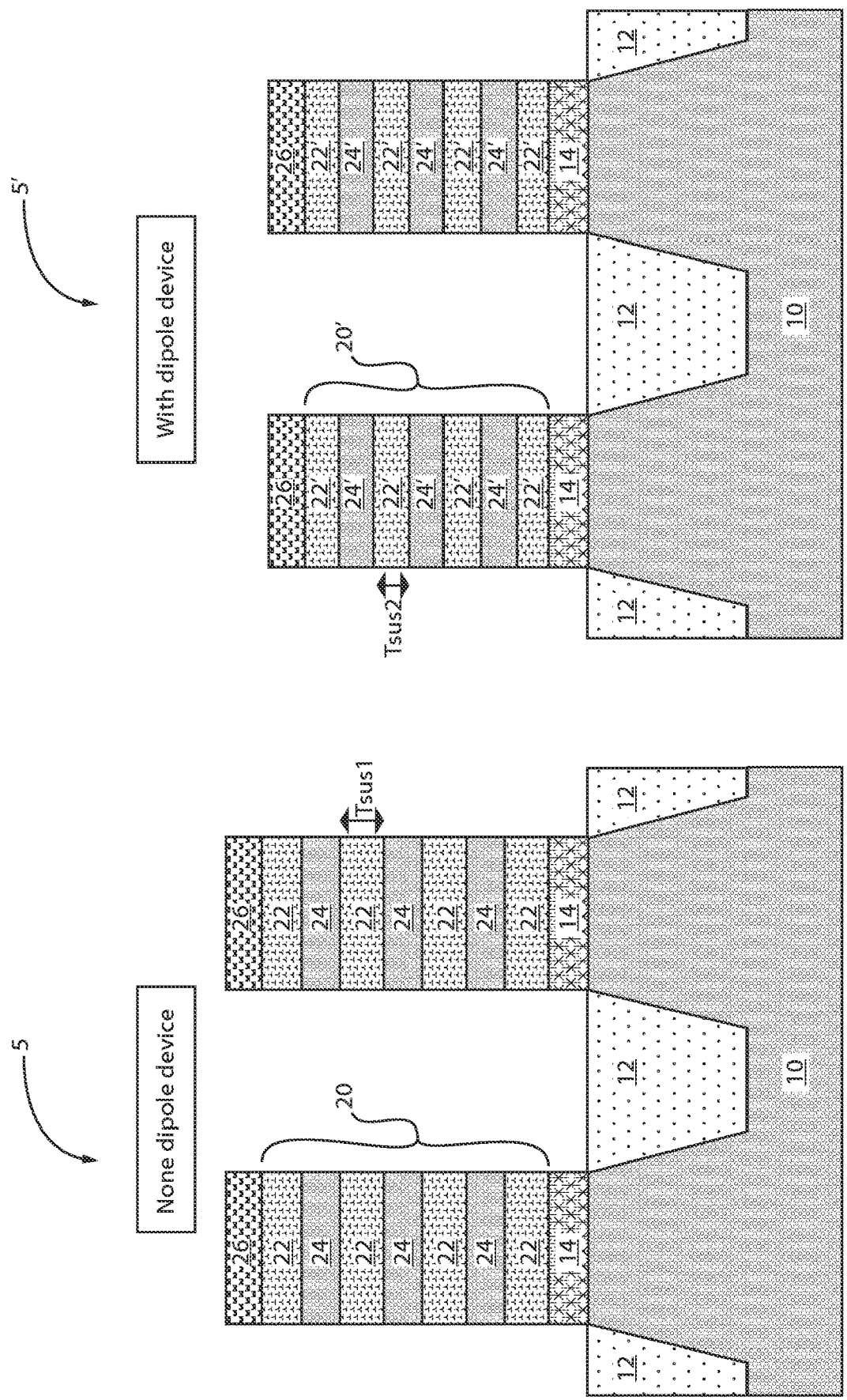
FIG. 1 is a cross-sectional view of a semiconductor structure including nanosheet stacks formed over a substrate, where sacrificial layers of a first region of the semiconductor structure have a first thickness and sacrificial layers of a second region of the semiconductor structure have a second thickness, in accordance with an embodiment of the present invention.

FIG. 1 is a cross-sectional view of a semiconductor structure including nanosheet stacks formed over a substrate, where sacrificial layers of a first region of the semiconductor structure have a first thickness and sacrificial layers of a second region of the semiconductor structure have a second thickness, in accordance with an embodiment of the present invention.

In various example embodiments, a semiconductor structure 5 includes shallow trench isolation (STI) regions 12 formed within a substrate 10. Multiple field effect transistor (FET) devices can be formed over the substrate 10. In one example, two FET devices can be formed over the substrate 10. The FET devices can be formed by constructing nanosheet stacks. In one example, first and second nanosheet stacks 20 can be constructed over the substrate 10.

Similarly, in various example embodiments, a semiconductor structure 5' includes shallow trench isolation (STI) regions 12 formed within a substrate 10. Multiple field effect transistor (FET) devices can be formed over the substrate 10. In one example, two FET devices can be formed over the substrate 10. The FET devices can be formed by constructing nanosheet stacks. In one example, first and second nanosheet stacks 20' can be constructed over the substrate 10.

An isolation layer 14 can be formed between the substrate 10 and the nanosheet stacks 20, 20' of structures 5, 5'. Additionally, a dummy capping layer 26 can be formed over the nanosheets stacks 20, 20' of structures 5, 5'.

The nanosheet stacks 20 of structure 5 can include alternating layers of a first semiconductor layer 22 and a second semiconductor layer 24. The first semiconductor layer 22 can be, e.g., silicon germanium (SiGe) and the second semiconductor layer 24 can be, e.g., silicon (Si).

The nanosheet stacks 20' of structure 5' can include alternating layers of a first semiconductor layer 22' and a second semiconductor layer 24'. The first semiconductor layer 22' can be, e.g., silicon germanium (SiGe) and the second semiconductor layer 24' can be, e.g., silicon (Si).

The difference between the structure 5 (left-hand side) and the structure 5' (right-hand side) is the thickness of the sacrificial layers 22, 22'. The thickness of first semiconductor layer 22 can be $Tsus_1$ and the thickness of second semiconductor layer 22' can be $Tsus_2$, where $Tsus_1 > Tsus_2$. It is noted that the nanosheet stacks 20, 20' can be formed on a common substrate 10. Thus, the dipole devices can be formed with no dipole devices on a common substrate 10. The left-hand side are the nanosheet stacks with no dipole devices and the right-hand side are the nanosheet stacks with dipole devices.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

The shallow trench isolation (STI) regions 12 can be formed by etching a trench in doped bottom source/drain (S/D) regions (not shown) utilizing a conventional dry etching process such as reactive ion etching (RIE) or plasma etching. The trenches can optionally be lined with a conventional liner material, e.g., silicon nitride or silicon oxynitride, and then chemical vapor deposition (CVD) or another like deposition process is used to fill the trench with silicon oxide or another like STI dielectric material. The STI dielectric can optionally be densified after deposition. A conventional planarization process such as chemical-mechanical polishing (CMP) can optionally be used to provide a planar structure.

Referring to, e.g., the first nanosheet stacks 20, the first semiconductor layer 22 can be the first layer in a stack of sheets of alternating materials. The first nanosheet stacks 20 include first semiconductor layers 22 and second semiconductor layers 24. Although it is specifically contemplated that the first semiconductor layers 22 can be formed from silicon germanium and that the second semiconductor layers 24 can be formed from silicon, it should be understood that any appropriate materials can be used instead, as long as the two semiconductor materials have etch selectivity with respect to one another. As used herein, the term "selective" in reference to a material removal process denotes that the rate of material removal for a first material is greater than the rate of removal for at least another material of the structure to which the material removal process is being applied. The alternating semiconductor layers 22/24 can be deposited by any appropriate mechanism. It is specifically contemplated that the semiconductor layers 22/24 can be epitaxially grown from one another, but alternate deposition processes, such as chemical vapor deposition (CVD), physical vapor deposition (PVD), atomic layer deposition (ALD), or gas cluster ion beam (GCIB) deposition, are also contemplated. A similar process can be applied to the semiconductor layers 22'/24' of the nanosheet stacks 20' in structure 5'.

Figure 2:
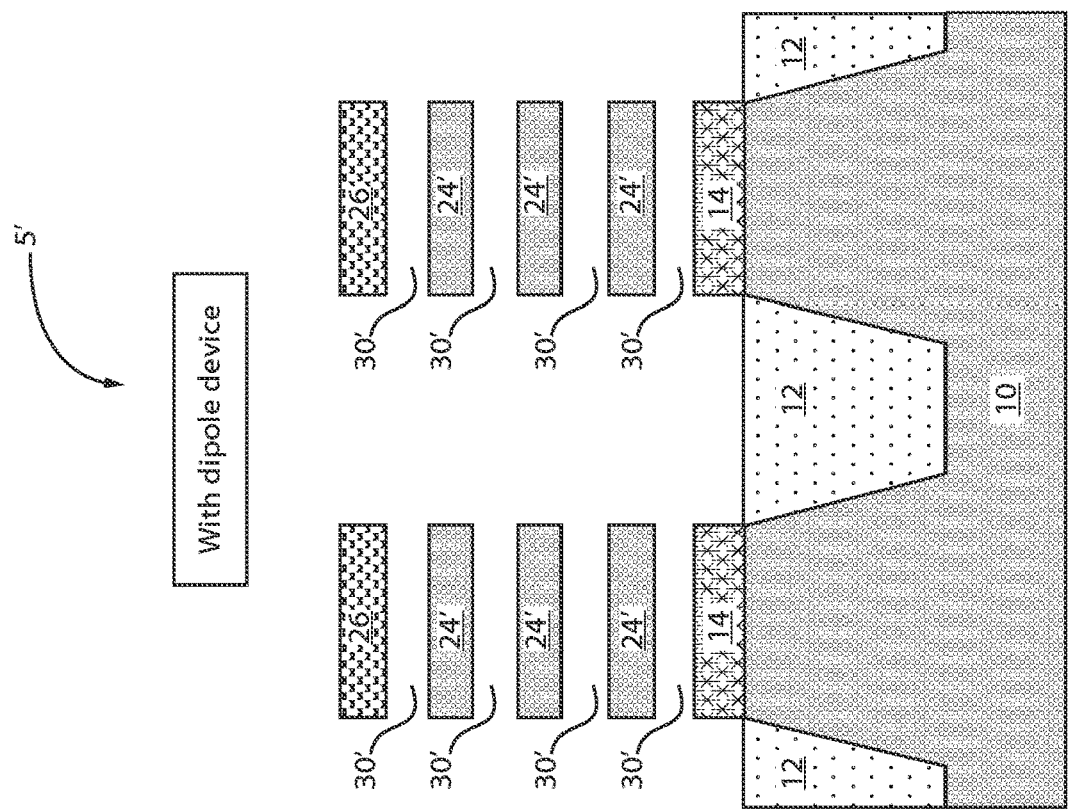
FIG. 2 is a cross-sectional view of the semiconductor structure of FIG. 1 where sacrificial layers of the multiple nanosheet stacks are removed, in accordance with an embodiment of the present invention.
Figure 2:
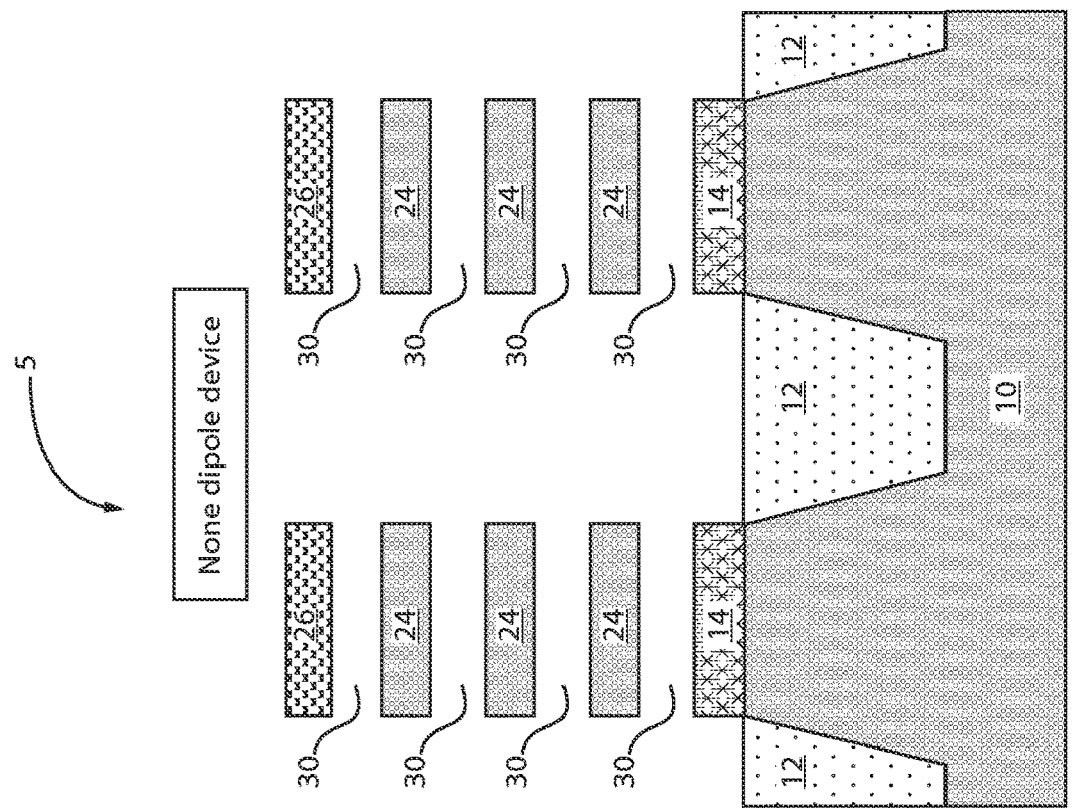

FIG. 2 is a cross-sectional view of the semiconductor structure of FIG. 1 where sacrificial layers of the multiple nanosheet stacks are removed, in accordance with an embodiment of the present invention.

In various example embodiments, the nanosheet stacks 20, 20' are etched. The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist.

In some examples, the selective wet etch or the selective dry etch can selectively remove the entire first semiconductor layers 22, 22' and leave the entirety or portions of the second semiconductor layers 24, 24'. The removal creates gaps or openings 30 between the second semiconductor layers 24 of the FET devices in structure 5 (left-hand side) and gaps or openings 30' between the second semiconductor layers 24' of the FET devices in structure 5' (right-hand side).

The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane ($CF_4$), nitrogen trifluoride ($NF_3$), sulfur hexafluoride ($SF_6$), and helium (He), and Chlorine trifluoride ($ClF_3$). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane ($CF_4$), and gas mixture with hydrogen ($H_2$). Chemical vapor etching can be performed by CVD with suitable pressure and temperature.

The etching also exposes a top surface of the STI regions 12.

Figure 3:
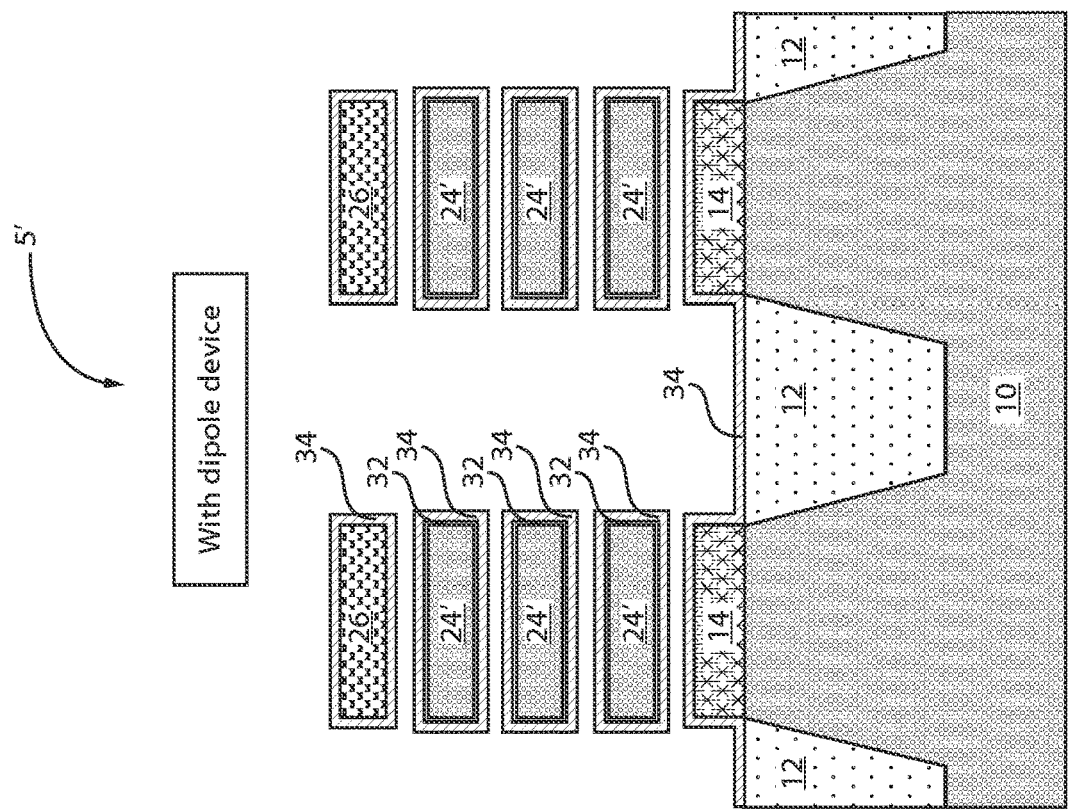
FIG. 3 is a cross-sectional view of the semiconductor structure of FIG. 2 where an interfacial layer/high-k dielectric (IL/HK) is formed adjacent remaining layers of the multiple nanosheet stacks, in accordance with an embodiment of the present invention.
Figure 3:
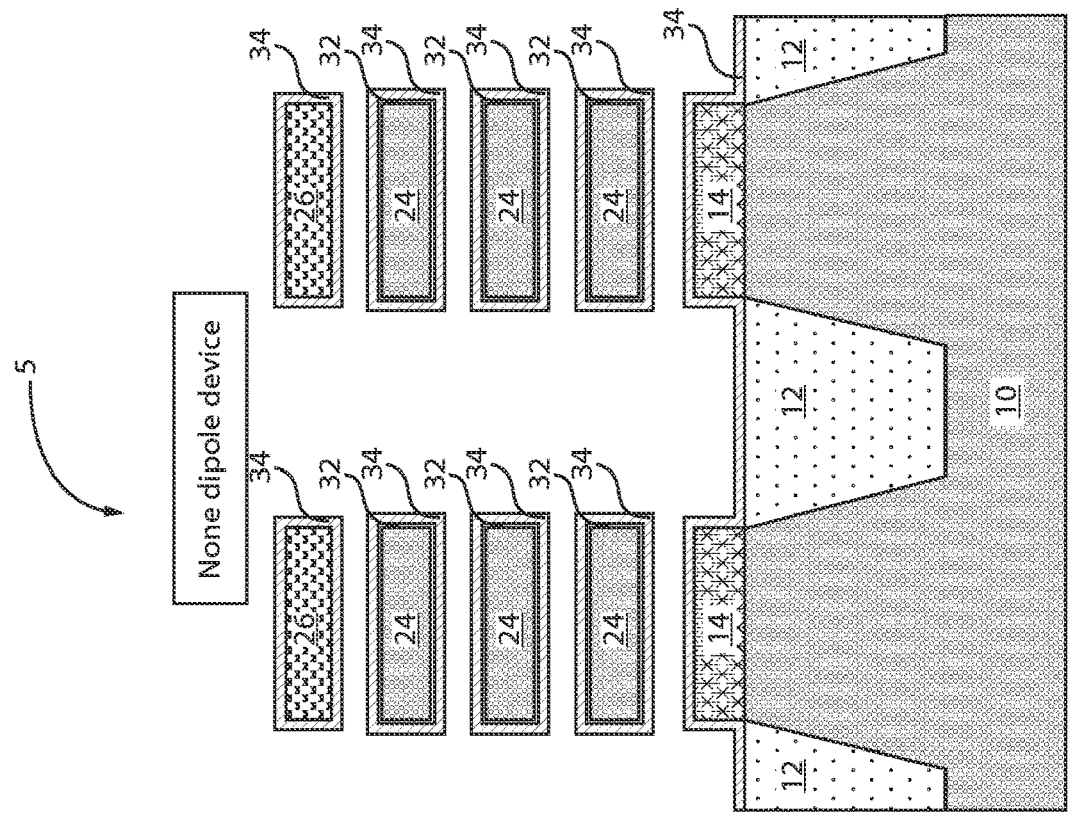

FIG. 3 is a cross-sectional view of the semiconductor structure of FIG. 2 where an interfacial layer/high-k dielectric (IL/HK) is formed adjacent remaining layers of the multiple nanosheet stacks, in accordance with an embodiment of the present invention.

In various example embodiments, interfacial layer/high-k dielectric (IL/HK) 32/34 is formed around each of the semiconductor layers 24, 24' of FET devices in structures 5, 5', respectively. The HK 34 can also be formed over the STI regions 12 and over the isolation layers 14.

In some embodiments, the interfacial layer (IL) 32 can be formed to wrap around second semiconductor layers 24, 24'. IL 32 can be deposited by any appropriate method, such as ALD, CVD, and ozone oxidation. IL 32 can include, e.g., oxide, HfSiO and oxynitride.

HK dielectric layer 34 can be deposited over and wrapped around the IL 32 by any suitable techniques, such as ALD, CVD, metal-organic CVD (MOCVD), physical vapor deposition (PVD), thermal oxidation, combinations thereof, or other suitable techniques. HK dielectric layer 34 can include, e.g., LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials.

HK dielectric layer 34 can include a single layer or multiple layers, such as metal layer, liner layer, wetting layer, and adhesion layer. HK dielectric layer 34 can include, e.g., Ti, Ag, Al, TiAlN, TaC, TaCN, TaSiN, Mn, Zr, TiN, TaN, Ru, Mo, Al, WN, Cu, W, or any suitable materials. HK dielectric layer 34 can be formed by ALD, PVD, CVD, or other suitable process. A CMP process can be performed to remove excessive HK dielectric layer 34.

Figure 4:
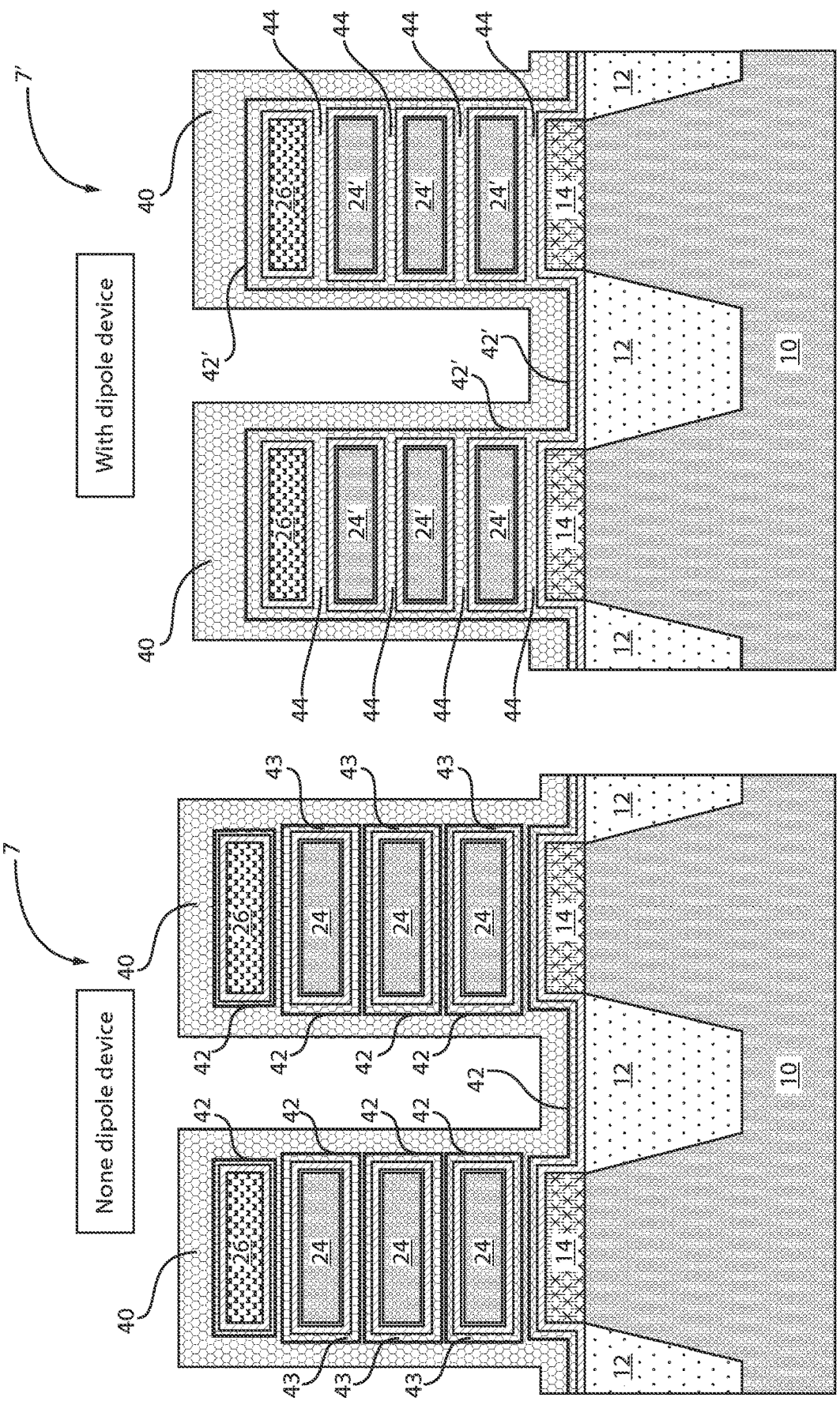
FIG. 4 is a cross-sectional view of the semiconductor structure of FIG. 3 where a material stack is deposited, in accordance with an embodiment of the present invention.

FIG. 4 is a cross-sectional view of the semiconductor structure of FIG. 3 where a material stack is deposited, in accordance with an embodiment of the present invention.

In various example embodiments, a material stack can be formed to wrap around IL/HK 32/34. The material stack can include three layers. The first layer can be, e.g., a titanium nitride (TiN) layer 43, the second layer can be, e.g., a zirconium oxide (ZrO) layer 42, and the third layer can be, e.g., a TiN layer 40.

In structure 7, the ZrO layer 42 wraps around each Si layer 24, individually, such that a TiN region 43 remains between the ZrO layer 42. In other words, the ZrO layer 42 is selectively driven into the middle regions including the HK dielectric layer 34. With a rapid thermal anneal (RTA) of about 950° C. and with a thickness of about 2 nm for the TiN region 43, the ZrO layer 42 can diffuse through the 2 nm TiN region 43 into the HK dielectric layer 34. Thus, the ZrO layer 42 is shown encompassing or enclosing each of the Si layers 24.

In contrast, in structure 7', the ZrO layer 42' wraps around all Si layer 24, collectively, such that a TiN region 44 remains between the HK dielectric layer 34. In other words, the TiN region 44 is pinched off such that the ZrO layer 42' does not diffuse into the HK dielectric layer 34.

Figure 5:
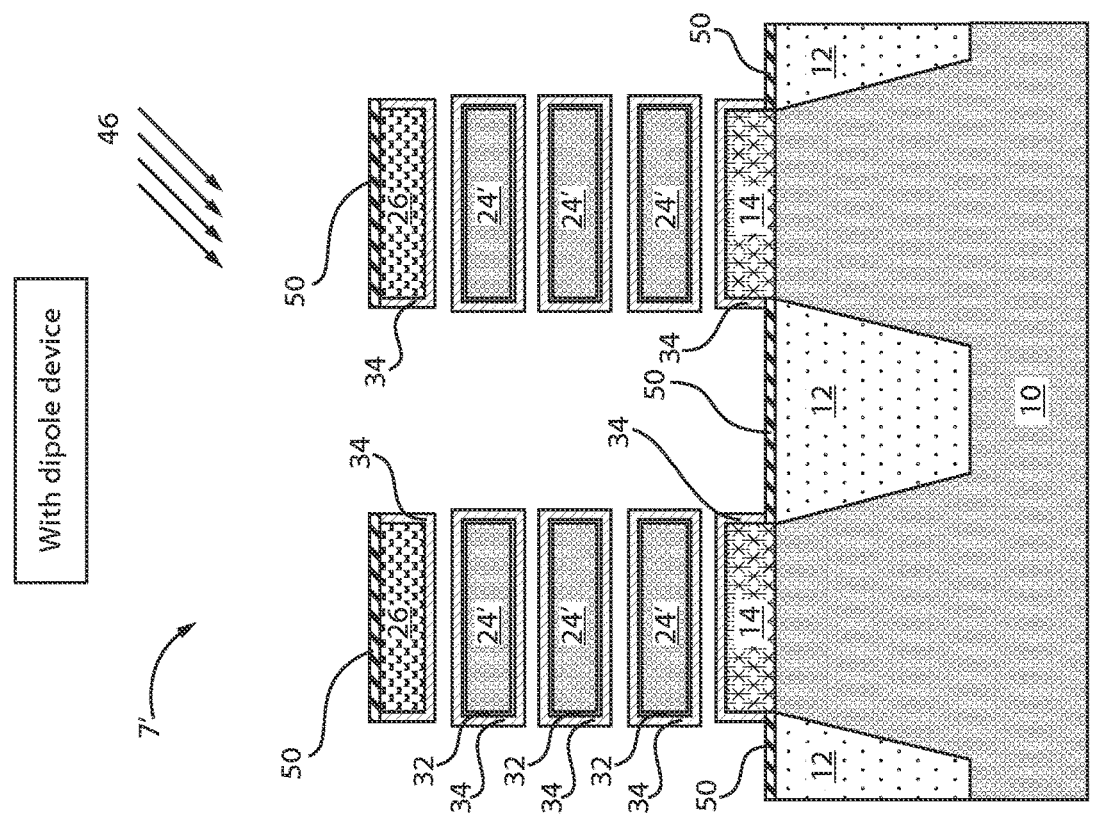
FIG. 5 is a cross-sectional view of the semiconductor structure of FIG. 4 where a portion of the material stack is selectively removed and an anneal takes place, in accordance with an embodiment of the present invention.
Figure 5:
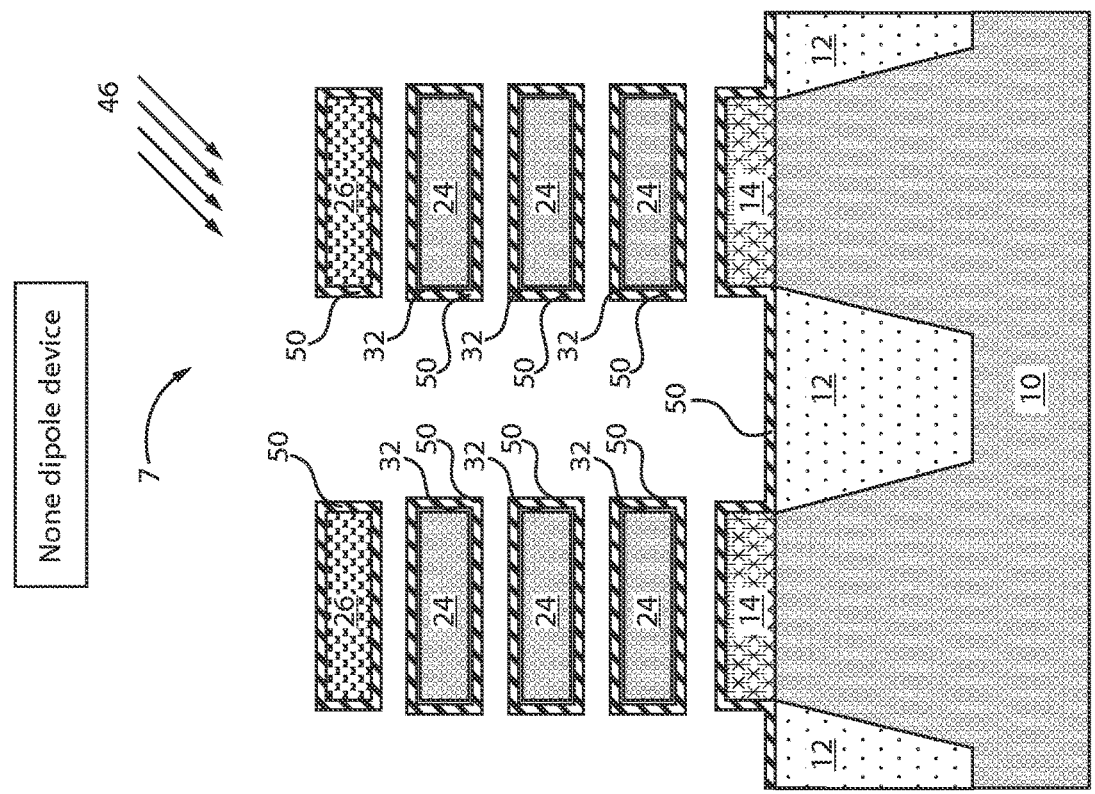

FIG. 5 is a cross-sectional view of the semiconductor structure of FIG. 4 where a portion of the material stack is selectively removed and an anneal takes place, in accordance with an embodiment of the present invention.

In various example embodiments, the material stack is selectively removed from the nanosheet stack 20 in structure 7 and from the nanosheet stack 20' in structure 7'. Selective removal of the material stack can be achieved by etching, such as an RIE etch.

The removal of the material stack results in the formation of a crystallized HK layer 50 with blanket PDA in structure 7 (left-hand side). The PDA can be applied at a temperature of about 500-700° C. without covering, which crystallizes the HK layer in structure 7 only (because Zr doped HK has a lower crystallization temperature than pure HK). In contrast, in structure 7' (right-hand side), the Si doped HK layer 34 has a higher crystallization temperature than pure HK. Thus, in structure 7', the HK layer 34 remains in an amorphous state, whereas in structure 7 the HK layer 34 is converted into a crystalline state designated as 50.

It is noted that the IL 32 remains intact in both structures 7 and 7'.

Therefore, the exemplary embodiments of the present invention employ different intersheet spacing ($T_{sus}$) to selectively dope HK in a large $T_{sus}$ region (structure 7) with a dopant, e.g., Zr, which decreases crystallization temperature. In other words, the intentional doping of HK is employed to selectively decrease crystallization temperature for certain regions only. Thus, the HK in structure 7' remains in an amorphous state.

Figure 6:
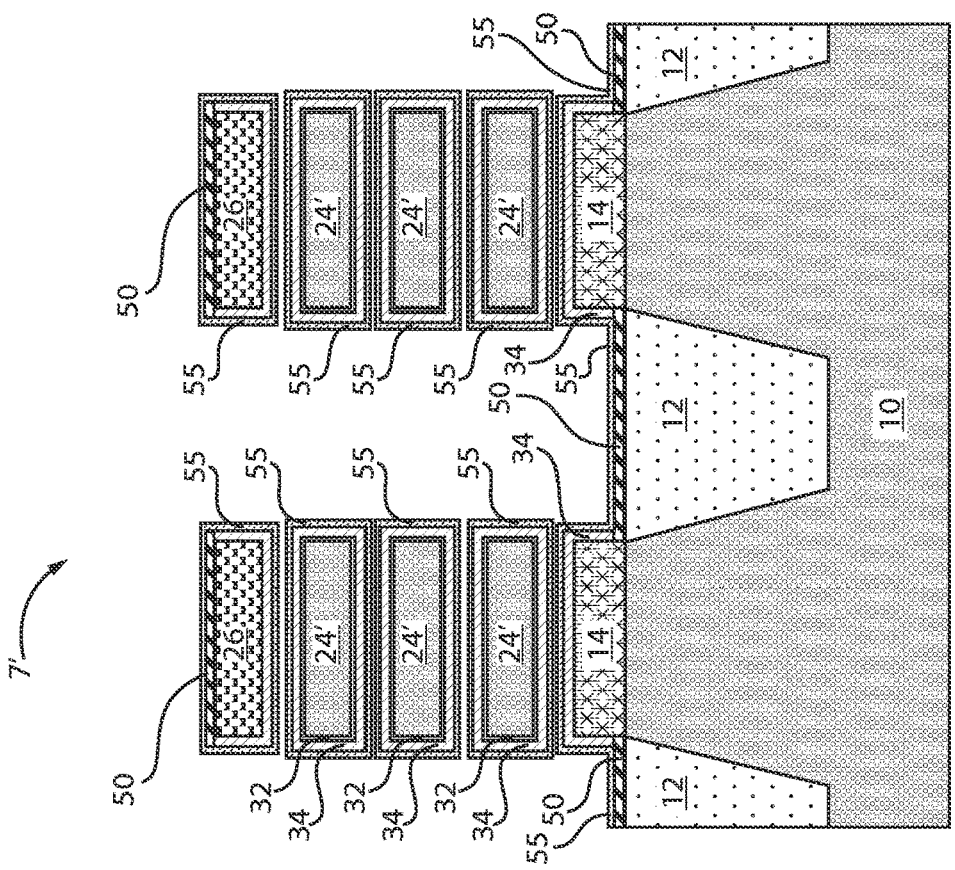
FIG. 6 is a cross-sectional view of the semiconductor structure of FIG. 5 where a dipole material is deposited, in accordance with an embodiment of the present invention.
Figure 6:
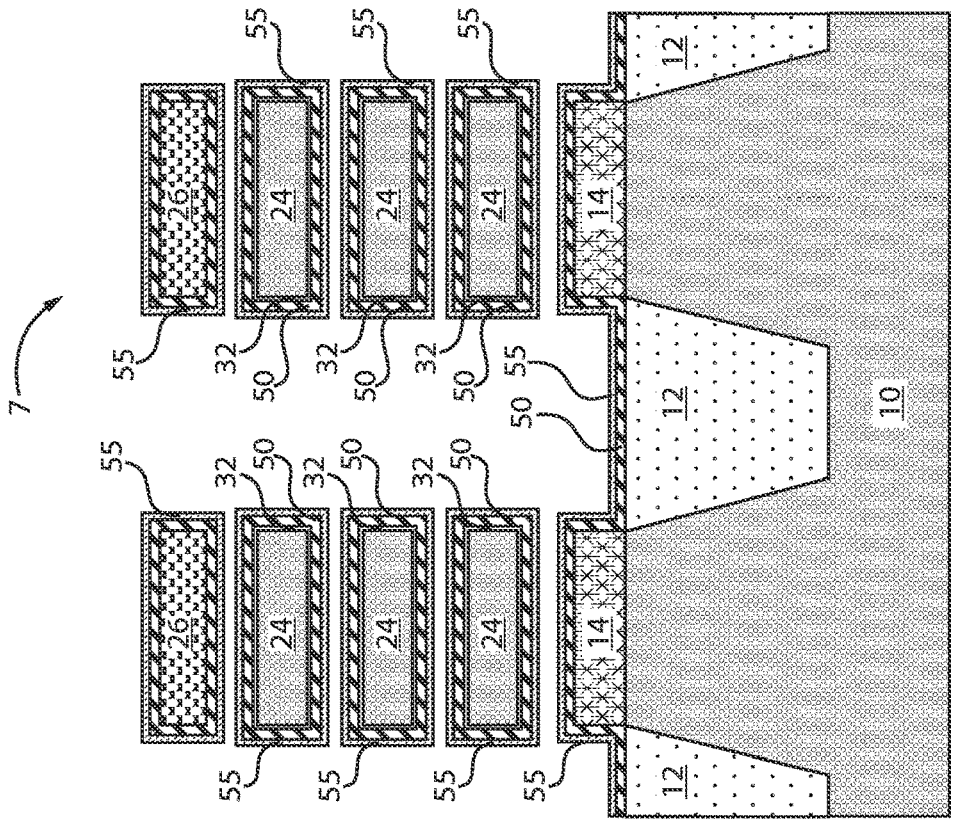

FIG. 6 is a cross-sectional view of the semiconductor structure of FIG. 5 where a dipole material is deposited, in accordance with an embodiment of the present invention.

In various example embodiments, a dipole material 55 is deposited.

The dipole material 55 wraps around the amorphous HK layer 34 in structure 7' and wraps around the crystallized HK layer 50 in structure 7. In one example, the dipole material 55 can be, e.g., lanthanum oxide (LaO). One skilled in the art can contemplate other earth elements employed to be diffused into HK layers, such, but not limited to, as dysprosium (Dy).

Therefore, the exemplary embodiments of the present invention employ dipole deposition and anneal such that the dipole only diffuses through the no dipole device. Thus, different threshold voltages (Vt) can be provided. In other words, a dipole material and crystallization are employed to modulate Vt by constructing a crystallized HK on a large $T_{sus}$ region and an amorphous HK on a small $T_{sus}$ region. This results in a gate-all-around device that can be constructed with different intersheet spacings and selective dipole diffusion to modulate Vt.

Figure 7:
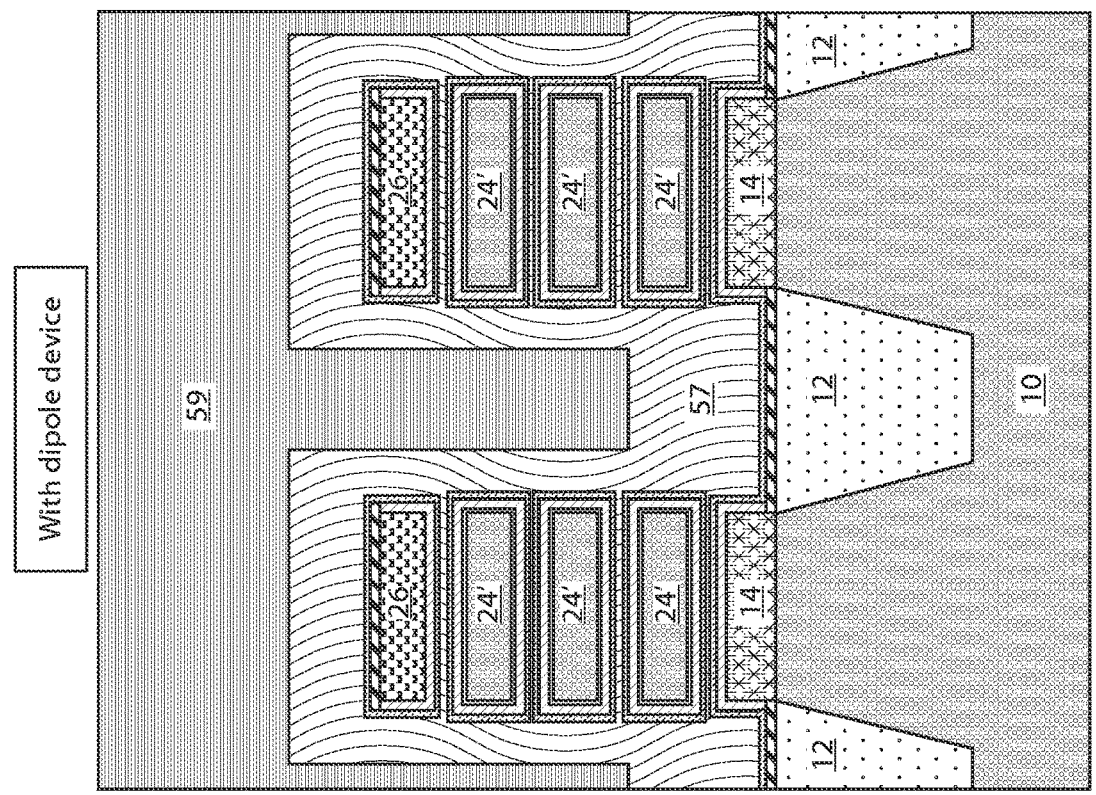
FIG. 7 is a cross-sectional view of the semiconductor structure of FIG. 6 where a sacrificial layer is deposited, a capping layer is deposited, and an anneal takes place to affect diffusion or no diffusion of the dipole material, in accordance with an embodiment of the present invention.
Figure 7:
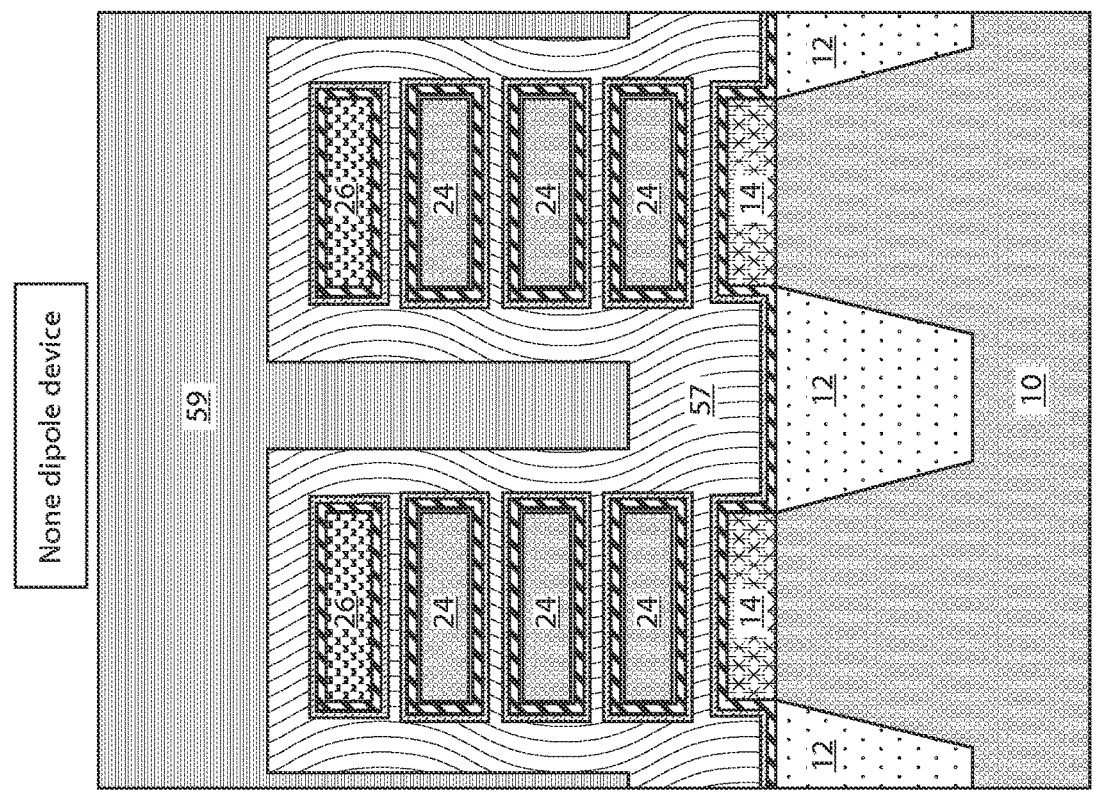

FIG. 7 is a cross-sectional view of the semiconductor structure of FIG. 6 where a sacrificial layer is deposited, a capping layer is deposited, and an anneal takes place to affect diffusion or no diffusion of the dipole material, in accordance with an embodiment of the present invention.

In various example embodiments, a sacrificial layer 57 is deposited, a capping layer 59 is deposited, and an anneal takes place to affect diffusion or no diffusion of the dipole material 55. The sacrificial layer 57 can be, e.g., TiN, whereas the capping layer 59 can be, e.g., amorphous silicon (a-Si). The anneal will cause the dipole material 55 to not diffuse in the crystallized HK layer 50 (left-hand side), whereas the anneal will cause the dipole material 55 to diffuse in the amorphous HK layer 34 (right-hand side). This results in effective modulation of the threshold voltage without patterning between nanosheet channels.

Figure 8:
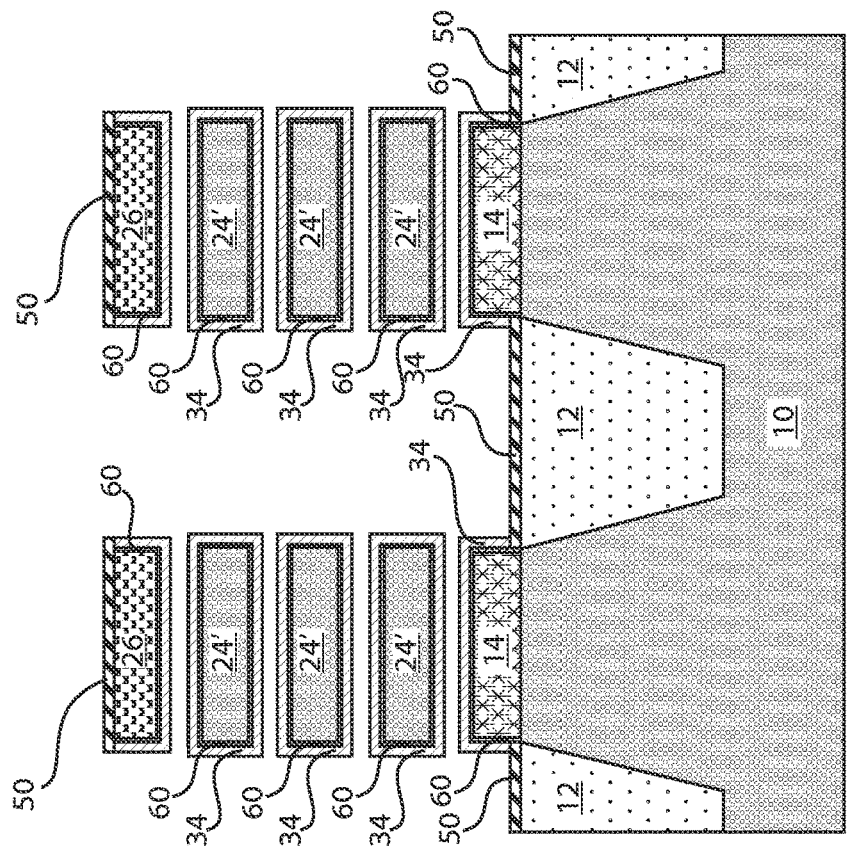
FIG. 8 is a cross-sectional view of the semiconductor structure of FIG. 7 where the sacrificial layer and the capping layer are removed, and the un-diffused dipole material is also removed, in accordance with an embodiment of the present invention.
Figure 8:
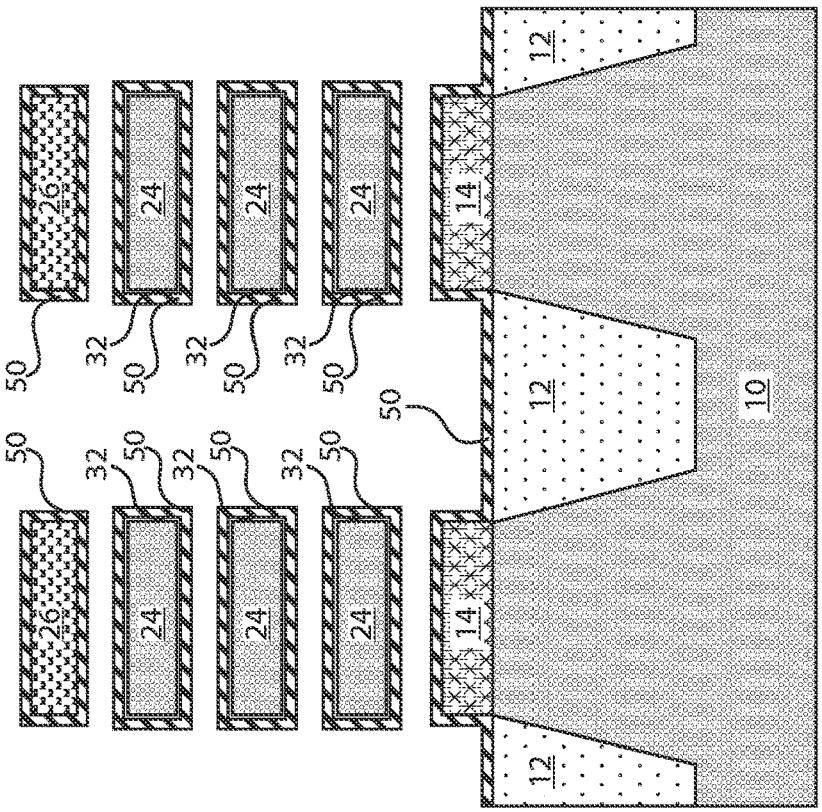

FIG. 8 is a cross-sectional view of the semiconductor structure of FIG. 7 where the sacrificial layer and the capping layer are removed, and the un-diffused dipole material is also removed, in accordance with an embodiment of the present invention.

In various example embodiments, the sacrificial layer 57 and the capping layer 59 are removed. The dipole material 55 is not diffused in the crystallized HK layer 50. Instead, the dipole material 55 is diffused only into the amorphous HK 34 (right-hand side) to form diffused dipole material 60.

The diffused dipole material 60 is illustrated within the amorphous HK layer 34. In contrast, the dipole material 60 is completely removed from the crystallized HK layer 50 and the isolation layer 14. The diffused dipole material 60 is only shown adjacent one surface of the dummy capping layer 26 in right-hand side structure.

As a result, the non-dipole device includes a crystalline HK material 50, where the HK layer is doped with Zr, and no dipole material 55 is found in the crystalline HK material 50. The dipole material 55 cannot diffuse into the crystalline HK material 50. In contrast, in the dipole device, there is an amorphous HK material 34, where the dipole material 55 can diffuse into the amorphous HK material 34.

Figure 9:
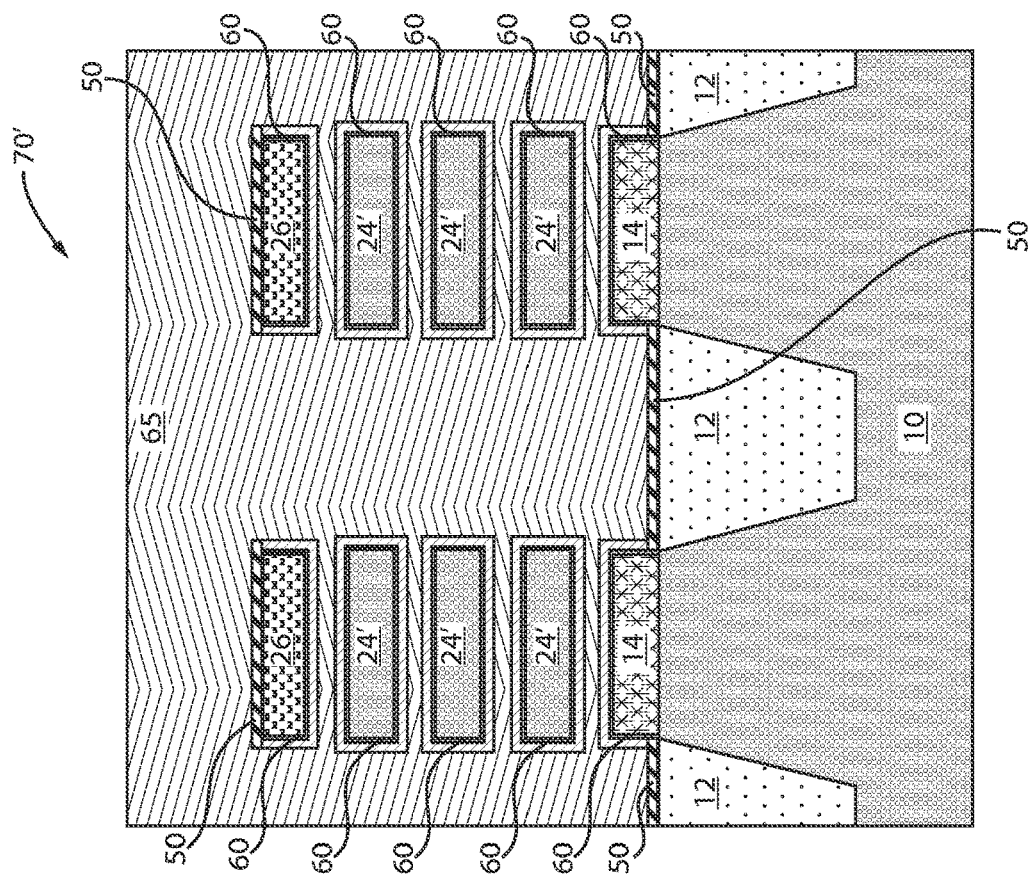
FIG. 9 is a cross-sectional view of the semiconductor structure of FIG. 8 where a gate material is deposited, in accordance with an embodiment of the present invention.
Figure 9:
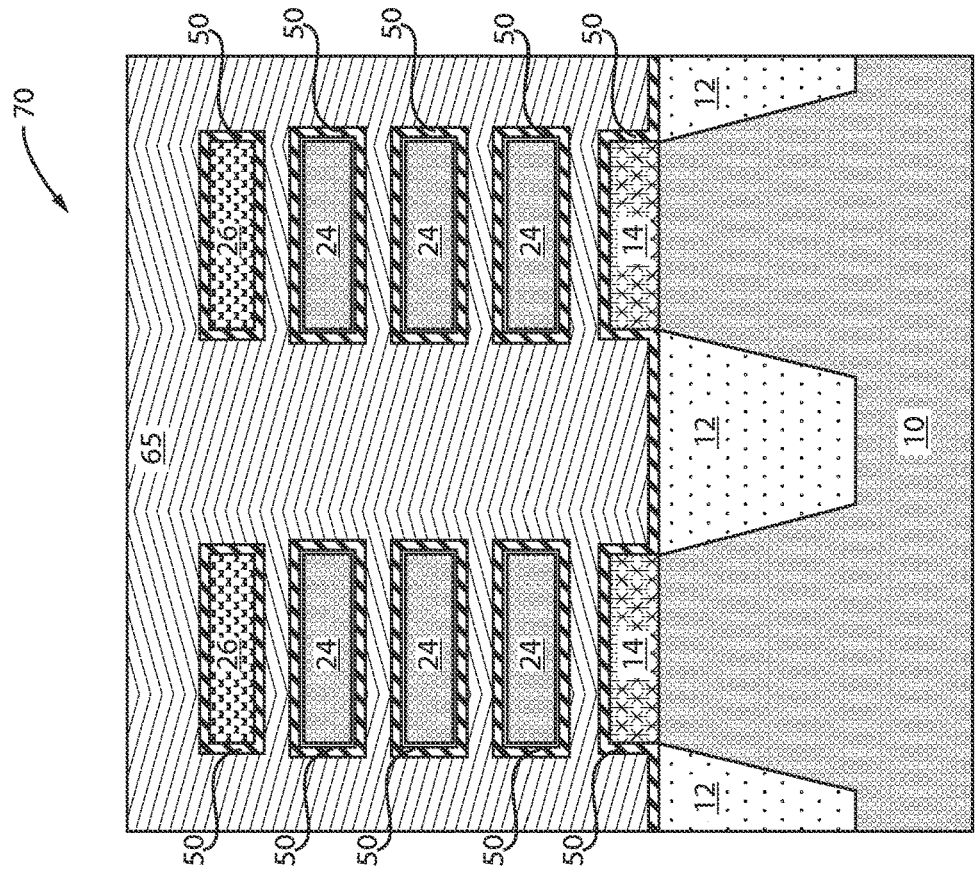

FIG. 9 is a cross-sectional view of the semiconductor structure of FIG. 8 where a gate material is deposited, in accordance with an embodiment of the present invention.

In various example embodiments, a work function metal (WFM) 65 can be deposited. The WFM 65 encompasses the non-dipole device 70 and the dipole device 70'.

The WFM 65 can be a metal, such as, e.g., copper (Cu), cobalt (Co), aluminum (Al), platinum (Pt), gold (Au), tungsten (W), titanium (Ti), nitride (N) or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. In various exemplary embodiments, the height of the WFM 65 can be reduced by chemical-mechanical polishing (CMP) and/or etching. Therefore, the planarization process can be provided by CMP. Other planarization process can include grinding and polishing.

In some embodiments, the nanosheet stacks can include a thin layer of conducting channel material. For example, in some embodiments, one or more of the nanosheet stacks can include Si, SiGe, Ge, and/or a Group III-V semiconductor material, for example InGaAs, but the inventive concept is not limited thereto. The term "Si nanosheet FET" refers to nanosheet FETs with nanosheets including Si or including a large percentage of Si, for example $Si_xGe_{1-x}$, where x is greater than about 0.3. The term "non-Si nanosheet FET" refers to nanosheet FETs with nanosheets not including Si, for example indium gallium arsenide (InGaAs), or including a small percentage of Si, for example $Si_yGe_{1-y}$, where y is less than about 0.3.

A non-Si nanosheet FET can have a higher channel carrier mobility than an equivalent Si nanosheet FET. The higher channel carrier mobility can result in higher performance. However, the non-Si nanosheet FET can also have higher band-to-band tunneling (BTBT) leakage current than the equivalent Si nanosheet FET. In general, high BTBT leakage current can occur in the same device design range as high channel carrier mobility. Several factors can induce higher BTBT leakage current in a non-Si nanosheet FET. For example, a parasitic-bipolar-effect (PBE) can effectively multiply a BTBT leakage current by a large value for non-Si nanosheet FETs with nanosheets including $Si_yGe_{1-y}$, where y is less than about 0.3, to result in a net BTBT-induced leakage current that is significantly high.

In conclusion, the exemplary embodiments of the present invention introduce a dopant (e.g., ZrO) into the gate dielectric layer, which decreases its crystalline temperature. Furthermore, by selectively crystallizing the gate dielectric in a designed device region, the dipole material can selectively diffuse through the amorphous dielectric layer, but no diffusion occurs in the crystalline dielectric layer. This enables multi-Vt without patterning between nanosheet channels.

The dipole forming element is present at the interfacial layer of the high Vt nFET and the low Vt pFET. Thus, a high Vt nFET and a low Vt pFET can include a crystallized HK layer with larger intersheet spacing ($T_{sus}$), whereas a low Vt nFET and a high Vt pFET can include an amorphous HK layer, with no dopant in the HK layer, and with smaller intersheet spacing ($T_{sus}$). The crystallized HK layer has a dopant, such as ZrO, due to its lower crystallization temperature than a pure HK material.

In conclusion, a method and/or structure is presented to achieve multi-Vt for nanosheet stacks in selected regions without patterning by introducing a dopant into amorphous gate dielectric layers on two types of nanosheet FET gate-all-around stacks, each type formed using a different sacrificial SiGe thickness between the silicon channels, such that the dopant diffuses into the gate dielectric layer of the stack formed using the larger SiGe thickness, but not into the gate dielectric of the stack formed with the smaller SiGe thickness and, thus, decreasing the crystalline temperature of the gate dielectric layer of the stack formed using the larger SiGe thickness, by using a blanket anneal to selectively crystallize gate dielectric in the doped gate dielectric layers in the stack formed using the greater sacrificial thickness between the silicon channels, and by introducing a dipole material, then using a spike anneal which causes the dipole material to selectively diffuse through the amorphous dielectric layer but not through the crystalline dielectric layer, thus creating a different threshold voltage (Vt) in each of the two nanosheet FET stacks.

Regarding FIGS. 1-9, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for attaining different gate threshold voltages across a plurality of field effect transistor (FET) devices without patterning between nanosheet channels (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for attaining different gate threshold voltages across a plurality of field effect transistor (FET) devices without patterning between nanosheet channels, the method comprising:

forming a first set of nanosheet stacks having a first intersheet spacing;

forming a second set of nanosheet stacks having a second intersheet spacing, where the first intersheet spacing is greater than the second intersheet spacing;

depositing a high-k (HK) layer within the first and second nanosheet stacks;

depositing a material stack that, when annealed, creates a crystallized HK layer in the first set of nanosheet stacks and an amorphous HK layer in the second nanosheet stacks;

depositing a dipole material; and selectively diffusing the dipole material into the amorphous HK layer of the second set of nanosheet stacks to provide the different gate threshold voltages for the plurality of FET devices.

2. The method of claim 1, wherein the material stack includes a first titanium nitride (TiN) layer, a zirconium oxide (ZrO) layer, and a second TiN layer.

3. The method of claim 2, wherein the material stack selectively dopes the HK layer with zirconium (Zr) to decrease a crystallization temperature and creates the crystallized HK layer in the first set of nanosheet stacks with the first intersheet spacing.

4. The method of claim 1, wherein the dipole material is lanthanum oxide (LaO).

5. The method of claim 1, wherein a sacrificial layer and a capping layer are deposited after deposition of the dipole material to enable diffusion of the dipole material into the amorphous HK layer of the second set of nanosheet stacks.

6. The method of claim 5, wherein the sacrificial layer is TiN and the capping layer is amorphous silicon (a-Si).

7. The method of claim 1, further comprising depositing a gate metal over first and second nanosheet stacks.

8. A method for modulating threshold voltages for nanosheet stacks without patterning between nanosheet channels, the method comprising:

forming first nanosheet stacks having a first intersheet spacing;

forming second nanosheet stacks having a second intersheet spacing, where the first intersheet spacing is greater than the second intersheet spacing;

constructing a crystallized high-k (HK) layer within the first nanosheet stacks;

constructing an amorphous high-k (HK) layer within the second nanosheet stacks;

depositing a dipole material; and selectively diffusing the dipole material into the amorphous HK layer of the second nanosheet stacks to modulate the threshold voltages for the nanosheet stacks.

9. The method of claim 8, further comprising depositing a material stack that, when annealed, creates the crystallized HK layer in the first nanosheet stacks and the amorphous HK layer in the second nanosheet stacks.

10. The method of claim 9, wherein the material stack includes a first titanium nitride (TiN) layer, a zirconium oxide (ZrO) layer, and a second TiN layer.

11. The method of claim 10, wherein the material stack selectively dopes the HK layer with zirconium (Zr) to decrease a crystallization temperature and creates the crystallized HK layer in the first nanosheet stacks with the first intersheet spacing.

12. The method of claim 8, wherein the dipole material is lanthanum oxide (LaO).

13. The method of claim 8, wherein a sacrificial layer and a capping layer are deposited after deposition of the dipole material to enable diffusion of the dipole material into the amorphous HK layer of the second nanosheet stacks.

14. The method of claim 13, wherein the sacrificial layer is TiN and the capping layer is amorphous silicon (a-Si).

15. The method of claim 8, further comprising depositing a gate metal over the first and second nanosheet stacks.

16. A semiconductor structure comprising:
   first nanosheet stacks having a first intersheet spacing;
   second nanosheet stacks having a second intersheet spacing, where the first intersheet spacing is greater than the second intersheet spacing;
   a crystallized high-k (HK) layer disposed within the first nanosheet stacks;
   an amorphous high-k (HK) layer disposed within the second nanosheet stacks; and
   a dipole material disposed within the first and second nanosheet stacks.

17. The semiconductor structure of claim 16, wherein the dipole material is lanthanum oxide (LaO).

18. The semiconductor structure of claim 16, wherein the crystallized HK layer includes a dopant to decrease a crystallization temperature.

19. The semiconductor structure of claim 18, wherein the dopant is zirconium oxide (ZrO).

20. The semiconductor structure of claim 16, wherein a gate metal directly contacts the crystallized HK layer within the first nanosheet stacks and the amorphous HK layer in the second nanosheet stacks.

* * * * *